(12) United States Patent
Heid et al.

(10) Patent No.: US 9,478,841 B2
(45) Date of Patent: Oct. 25, 2016

(54) RF GENERATOR

(75) Inventors: Oliver Heid, Erlangen (DE); Timothy Hughes, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 211 days.

(21) Appl. No.: 14/115,515

(22) PCT Filed: Oct. 13, 2011

(86) PCT No.: PCT/EP2011/067904
§ 371 (c)(1),
(2), (4) Date: Nov. 4, 2013

(87) PCT Pub. No.: WO2012/149986
PCT Pub. Date: Nov. 8, 2012

(65) Prior Publication Data
US 2014/0077729 A1    Mar. 20, 2014

(30) Foreign Application Priority Data

May 4, 2011  (DE) .................. 10 2011 075 219

(51) Int. Cl.
*H05H 7/00* (2006.01)
*H01P 3/13* (2006.01)
*H01P 5/107* (2006.01)
*H01P 5/12* (2006.01)
*H03B 5/18* (2006.01)
(Continued)

(52) U.S. Cl.
CPC ............... *H01P 3/13* (2013.01); *H01P 5/107* (2013.01); *H01P 5/12* (2013.01); *H03B 5/1817* (2013.01); *H05H 7/02* (2013.01); *H05H 9/00* (2013.01); *H05H 13/00* (2013.01)

(58) Field of Classification Search
CPC .............. H01P 3/13; H01P 3/12; H01P 5/00; H01P 1/212; H01P 1/207; H05H 13/00; H05H 7/02; H05H 7/18; H05H 2007/025; H03L 7/00; H03B 1/02
USPC ............... 315/500–507, 39; 331/96, 107 DP, 331/108 R, 227, 242
See application file for complete search history.

(56) References Cited

U.S. PATENT DOCUMENTS 4,234,854 A   11/1980  Schellenberg et al.
4,283,685 A   8/1981   MacMaster et al.
(Continued)

FOREIGN PATENT DOCUMENTS

DE   102009053624      5/2011
DE   102011075219.6    5/2011
(Continued)

OTHER PUBLICATIONS

Heid, O., et al., "Compact Solid State Direct Drive RF LINAC", Proceedings of IPAC (2010), Kyoto, Japan, May 2010, pp. 4278-4280.*
(Continued)

*Primary Examiner* — Lincoln Donovan
*Assistant Examiner* — Thomas Skibinski
(74) *Attorney, Agent, or Firm* — Slayden Grubert Beard PLLC

(57) ABSTRACT

An RF generator has a hollow conductor having a conductive wall. The wall has a first slot, over which a first solid-state switch is arranged in order to apply a radiofrequency electrical voltage through the first slot.

20 Claims, 4 Drawing Sheets

(51) Int. Cl.
*H05H 7/02* (2006.01)
*H05H 9/00* (2006.01)
*H05H 13/00* (2006.01)

(56) References Cited

U.S. PATENT DOCUMENTS

| | | | |
|---|---|---|---|
| 5,084,682 A * | 1/1992 | Swenson | H05H 7/02 |
| | | | 315/5.41 |
| 5,497,050 A | 3/1996 | Cheo | |
| 7,339,320 B1 | 3/2008 | Meddaugh et al. | |
| 2007/0229182 A1 | 10/2007 | Gaucher et al. | |
| 2012/0133306 A1 | 5/2012 | Seliger et al. | |
| 2012/0229054 A1 * | 9/2012 | Baurichter | H05H 7/02 |
| | | | 315/505 |

FOREIGN PATENT DOCUMENTS

| | | |
|---|---|---|
| EP | 0606870 | 7/1994 |
| JP | 6-342700 | 12/1994 |
| JP | 2007-517376 | 6/2007 |
| JP | 2013-501328 | 1/2013 |
| RU | 2113056 C1 | 6/1998 ............... H04B 1/04 |
| RU | 86062 U1 | 8/2009 ............... H01P 7/04 |
| WO | PCT/EP2011/067904 | 10/2011 |

OTHER PUBLICATIONS

English Language International Search Report for PCT/EP2011/067904, mailed Feb. 13, 2012, 3 pages.
German Office Action for German Priority Patent Application No. 10 2011 075 219.6, issued Dec. 8, 2011, 6 pages.
O. Heid et al., "Compact Solid State Direct Drive RF LINAC," Proceedings of IPAC'10, Kyoto, Japan, 2010, 3 pages.
Jürgen Detlefsen et al., "Grundlagen der Hochfrequenztechnik (*Fundamentals of High Frequency Technology*, $3^{rd}$ Updated and Extended Edition)," Oldenbourg Verlag München, 2009, 13 pages.
Office Action mailed Dec. 16, 2014 for corresponding Japanese Patent Application No. 2014-508697.
Russian Office Action, Application No. 2012101773/08, 7 pages, May 24, 2016.

* cited by examiner

RF GENERATOR

CROSS REFERENCE TO RELATED APPLICATIONS

This application is based on and hereby claims priority to International Application No. PCT/EP2011/067904 filed on Oct. 13, 2011 and German Application No. 10 2011 075 219.6 filed on May 4, 2011, the contents of which are hereby incorporated by reference.

BACKGROUND

The present invention relates to an RF generator and to a particle accelerator comprising an RF generator.

It is known to generate RF power using tetrodes, klystrons or other apparatuses. It is furthermore known to convey RF power using waveguides, for example hollow conductors. According to previous solutions, the RF power is generated at a first position and then transported by a waveguide to a second position where the RF power is coupled, for example by an attenuating element or an inductive coupler, for example into a cavity. In such an arrangement, however, power losses necessarily occur at the coupling positions. Furthermore, such arrangements require a large amount of space.

It is furthermore known to provide RF cavities with integrated drive apparatuses in order to excite a radiofrequency electromagnetic resonance in the cavity. Such an RF cavity is described, for example, in EP 0 606 870 A1.

SUMMARY

It is one possible to provide an apparatus in which the generation of RF power and the delivery of the generated RF power are carried out by the same apparatus. It is furthermore an additional potential object to provide a particle accelerator comprising such an RF generator.

The inventors propose an RF generator comprising a hollow conductor having a conductive wall, which has a first slot. A first solid-state switch is arranged over the first slot in order to apply a radiofrequency electrical voltage through the first slot. Advantageously, in this RF generator, the RF power is excited directly in the hollow conductor transporting the RF power. This reduces the complexity and manufacturing costs of the RF generator. A further advantage relates to the use of the solid-state switch, which offers increased flexibility compared with conventional apparatuses for generating RF power and can be configured more compactly and more economically.

Preferably, the hollow conductor has a circular cross section. Advantageously, hollow conductors with a circular cross section have particularly suitable resonant modes.

In another embodiment, the hollow conductor has a rectangular cross section. Hollow conductors with a rectangular cross section are advantageously also highly suitable for the transmission of RF resonances.

Preferably, the RF generator is formed so as to excite a TE10 resonant mode in the hollow conductor.

It is expedient for the first solid-state switch to be arranged in a shielding housing. This advantageously reduces radiation of RF power.

In one refinement of the RF generator, it comprises a phase control device which is formed so as to generate a first phase control signal. In this case, the RF generator is furthermore formed so as to deliver the first phase control signal to the first solid-state switch. Advantageously, the solid-state switch can then synchronize the delivered radiofrequency electrical voltage with the phase control signal.

In a preferred embodiment of the RF generator, a second solid-state switch is arranged over the first slot. Advantageously, more RF power can then be generated. It is also possible to arrange even more solid-state switches in parallel with the first and second solid-state switches over the first slot, in order to further increase the RF power generated.

Preferably, the first and second solid-state switches are arranged in a common shielding housing. Advantageously, the RF power radiated by the solid-state switches is then reduced by the shielding housing.

It is expedient for the RF generator to be formed so as to deliver the first phase control signal to the second solid-state switch as well. Advantageously, the first and second solid-state switches can then couple RF power into the hollow conductor synchronously with one another and with the phase control signal.

In one refinement of the RF generator, the wall comprises a second slot, a third solid-state switch being arranged over the second slot. Advantageously, the RF power which can be generated by the RF generator can also be increased by this.

In an alternative embodiment of the RF generator, a third solid-state switch is arranged over the first slot. Advantageously, the RF power which can be generated by the RF generator can also be increased by this.

It is expedient for the third solid-state switch to be arranged in a second shielding housing. Advantageously, the RF power radiated by the third solid-state switch is then also reduced.

In an additional refinement of the RF generator, the phase control device is furthermore formed so as to generate a second phase control signal, the RF generator being formed so as to deliver the second phase control signal to the third solid-state switch. Advantageously, the third solid-state switch can then deliver a radiofrequency electrical voltage synchronous with the second phase control signal.

It is particularly expedient for the phase control device to be formed so as to generate the first phase control signal and the second phase control signal with a phase shift of 180° with respect to one another.

In one refinement of the RF generator, the hollow conductor is coupled to a cavity. Advantageously, the RF power generated by the RF generator can then be conveyed through the hollow conductor into the cavity.

A particle accelerator according to the inventors' proposal comprises an RF generator of the aforementioned type. Advantageously, the RF power generated by the RF generator can then be used to accelerate charged particles.

BRIEF DESCRIPTION OF THE DRAWINGS

These and other objects and advantages of the present invention will become more apparent and more readily appreciated from the following description of the preferred embodiments, taken in conjunction with the accompanying drawings of which.

Figure 1:
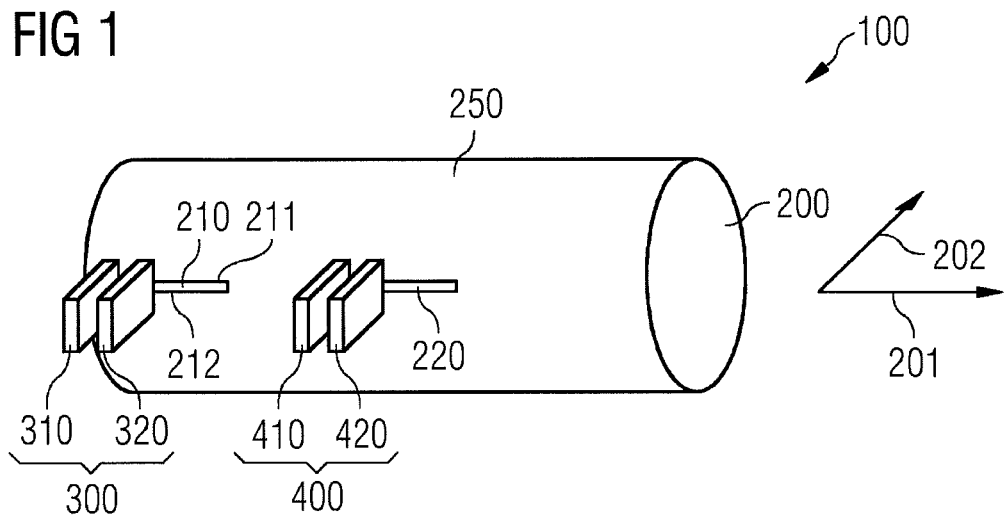
FIG. 1 shows a first perspective representation of an RF generator according to a first embodiment.

DETAILED DESCRIPTION OF THE
PREFERRED EMBODIMENT

Reference will now be made in detail to the preferred embodiments of the present invention, examples of which are illustrated in the accompanying drawings, wherein like reference numerals refer to like elements throughout.

FIG. 1 shows a schematic perspective representation of an RF generator 100 according to a first embodiment. The RF generator 100 is used to generate radiofrequency electromagnetic waves with a high power. The RF power generated by the RF generator 100 may, for example, be used in a particle accelerator to accelerate charged particles.

The RF generator 100 comprises a hollow conductor 200. The hollow conductor 200 substantially has a hollow-cylindrical shape and is formed of an electrically conductive material, preferably a metal. The axial direction of the cylindrical hollow conductor 200 defines a longitudinal direction 201. A radial direction 202 extends perpendicularly to the longitudinal direction 201. The hollow conductor 200 has a circular cross section. The hollow conductor 200 could, however, also have an elliptical or other cross section.

A lateral surface of the cylindrical hollow conductor 200 is formed by a wall 250. When an electromagnetic resonant mode is excited in the hollow conductor 200, position- and time-dependent electrical currents flow in the wall 250. The spatial and temporal profile of these electrical currents depends on the resonant mode excited in the hollow conductor 200, can be calculated and is known to persons skilled in the art.

The wall 250 of the hollow conductor 200 of the RF generator 100 comprises a first slot 210 and a second slot 220. The slots 210, 220 are arranged at positions of the wall 250 where a large electrical current flows when a desired resonant mode is excited in the hollow conductor 200. The profile of the slots 210, 220 is oriented perpendicularly to the direction of the flow of current. In the example represented, the slots 210, 220 are oriented parallel to the longitudinal direction 201. The slots 210, 220 may, however, also be oriented in a different way.

A first group 300 of solid-state switches is arranged on the first slot 210 in the wall 250 of the hollow conductor 200. In the example represented, the first group 300 comprises a first solid-state switch 310 and a second solid-state switch 320. The first group 300 could, however, also comprise merely one solid-state switch 310. In general, however, the first group 300 will comprise at least two solid-state switches 310, 320.

The solid-state switches 310, 320 respectively have a first output terminal 311 and a second output terminal 312 (FIG. 3) and are formed so as to apply a radiofrequency electrical voltage between the output terminals 311, 312 and so as to switch a radiofrequency electrical current. To this end, the solid-state switches 310, 320 may, for example, comprise solid-state transistors. The solid-state switches 310, 320 may, however, also be constructed in a different way. The term solid-state switch is not to be interpreted as restrictive in this sense.

The first solid-state switch 310 and the second solid-state switch 320 are respectively connected electrically conductively to a section of the wall 250 on a first side 211 of the first slot 210 and to a section of the wall 250 on a second side 212 of the first slot 210, so that the solid-state switches 310, 320 can apply a radiofrequency electrical voltage through the first slot 210. Electrical currents flowing in the wall 250 can thereby be excited, which in turn excite a resonant mode in the hollow conductor 200.

A second group 400 of solid-state switches is arranged over the second slot 220 of the wall 250 of the hollow conductor 200 of the RF generator 100, which group in the example represented comprises a third solid-state switch 410 and a fourth solid-state switch 420. The second group 400 may also comprise more or fewer than two solid-state switches 410, 420. Electrical currents can also be excited in the wall 250 of the hollow conductor 200 by the solid-state switches 410, 420 of the second group 400, which currents in turn excite a resonant mode in the hollow conductor 200.

Figure 4:
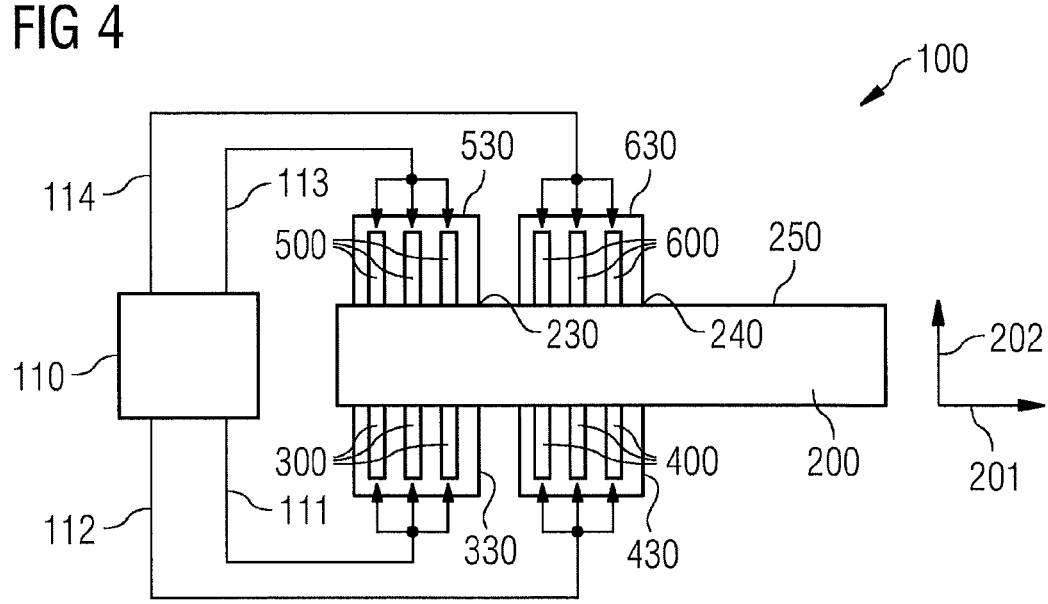
FIG. 4 shows a plan view of the RF generator of the first embodiment.

In the plan view of the RF generator 100 shown in FIG. 4, it can be seen that the wall 250 of the hollow conductor 200 of the RF generator 100 comprises a third slot 230 (not visible in FIG. 1) and a fourth slot 240 (not visible in FIG. 1). The third slot 230 lies opposite the first slot 210 in the radial direction 202. The fourth slot 240 lies opposite the second slot 230 in the radial direction 202. A third group 500 of solid-state switches is arranged over the third slot 230. A fourth group 600 of solid-state switches is arranged over the fourth slot 240.

The wall 250 of the hollow conductor 200 may comprise further slots, over which groups of solid-state switches are likewise respectively arranged. All the slots are in this case arranged on the wall 250 of the hollow conductor 200 so that currents, which lead to excitation of the desired resonant mode in the hollow conductor 200, can be excited in the wall 250 by the solid-state switches.

Figure 2:
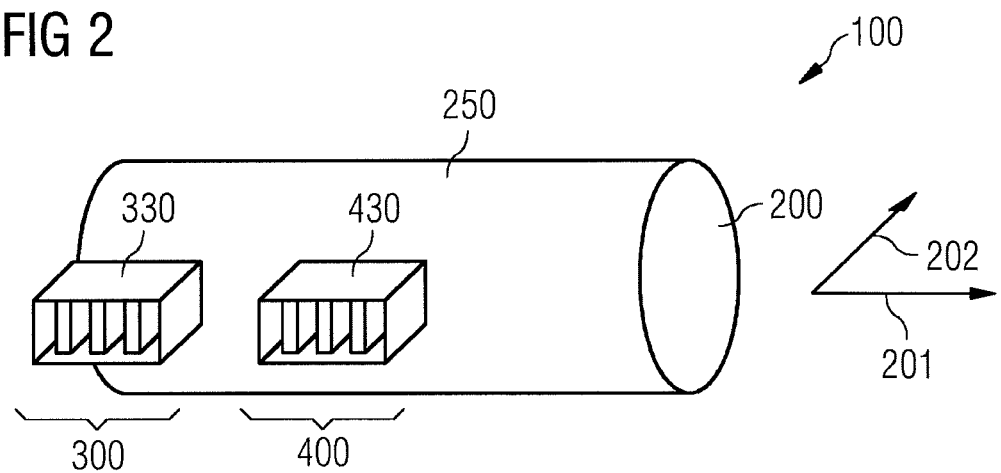
FIG. 2 shows a second perspective representation of the RF generator of the first embodiment.

FIG. 2 shows a further schematic perspective representation of the RF generator 100. FIG. 2 shows that the first group 300 of solid-state switches 310, 320 on the first slot 210 of the wall 250 of the hollow conductor 200 is arranged in a first shielding housing 330. Correspondingly, the solid-state switches 410, 420 of the second group 400 are arranged in a second shielding housing 430. The shielding housings 330, 430 are formed of an electrically conductive material, preferably a metal. The shielding housings are electrically conductively connected to the wall 250 and are used to shield electromagnetic power radiated by the solid-state switches 310, 320, 410, 420. The radiation losses of the RF generator 100 are reduced by this. A possible perturbing influence of the RF generator 100 on other equipment in the vicinity of the RF generator 100 is furthermore reduced by this.

In the schematic representation of FIG. 2, the shielding housings 330, 430 are open outward in the radial direction 202. This representation, however, has been selected merely for the sake of clarity. Preferably, the shielding housings 330, 430 fully enclose the solid-state switches 310, 320, 410, 420.

The third group 500 of solid-state switches, arranged over the third slot 230, is located in a third shielding housing 530. The fourth group 600 of solid-state switches, arranged over the fourth slot 240, is located in a fourth shielding housing 630.

Figure 3:
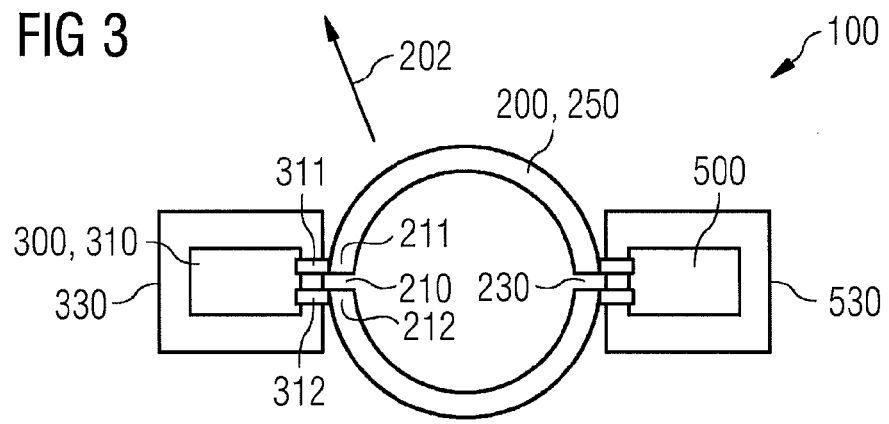
FIG. 3 shows a sectional representation of the RF generator of the first embodiment.

FIG. 3 shows a section, perpendicular to the longitudinal direction 201, through the RF generator 100 in a schematic representation. The hollow conductor 200, formed as a hollow cylinder, can be seen with its wall 250. The wall 250 comprises the first slot 210 and the third slot 230. The third slot 230 lies opposite the first slot 210 in the radial direction 202.

The first group 300 of solid-state switches 310, 320 is arranged over the first slot 210. The first group 300 of solid-state switches 310, 320 is arranged in the first shielding housing 330. Only the first solid-state switch 310 can be seen. The first solid-state switch 310 comprises a first output terminal 311 and a second output terminal 312. The first output terminal 311 is conductively connected to a section of the wall 250 on the first side 211 of the first slot 210, while the second output terminal 312 is electrically conductively connected to a section of the wall 250 on the second side 212 of the first slot 210. The second solid-state switch 320 and all other solid-state switches of the first group 300 comprise corresponding output terminals 311, 312, which are correspondingly connected to the wall 250. This also applies for the solid-state switches of the other groups 400, 500, 600.

FIG. 4 shows a schematic plan view of the RF generator 100. The hollow conductor 200 with the first group 300 of solid-state switches 310, 320, the second group 400 of solid-state switches 410, 420, the third group 500 of solid-state switches and the fourth group 600 of solid-state switches can be seen.

It has already been mentioned that the electrical currents flowing in the wall 250 of the hollow conductor 200 are position- and time-dependent. The electrical currents flowing at the positions of the slots 210, 220, 230, 240 of the wall 250 therefore have phase angles differing from one another at each instant. The groups 300, 400, 500, 600 of solid-state switches must therefore excite the electrical currents with different phase angles. The solid-state switches of each individual group 300, 400, 500, 600 must in this case switch the electrical current synchronously with one another.

The RF generator 100 comprises a phase control device 110 (represented only schematically) which is formed so as to generate a multiplicity of phase control signals 111, 112, 113, 114. The phase control signals 111, 112, 113, 114 respectively have the same frequency, but phase angles differing from one another. The first phase control signal 111 is delivered to the first group 300 of solid-state switches. The second phase control signal 112 is delivered to the second group 400 of solid-state switches. The third phase control signal 113 is delivered to the third group 500 of solid-state switches. The fourth phase control signal 114 is delivered to the fourth group 600 of solid-state switches. If the RF generator 100 comprises further groups of solid-state switches, which are arranged over further slots of the wall 250 of the hollow conductor 200, then the phase control device 110 outputs further phase control signals which are delivered to the further groups of solid-state switches.

Each of the solid-state switches of the groups 300, 400, 500, 600 is formed so as to switch the voltage output by it via the output terminals 311, 312 synchronously with the phase control signal 111, 112, 113, 114 delivered to it. The solid-state switches of the first group 300 thus excite an electrical current in the wall 250 synchronously with the first phase control signal 111. The solid-state switches of the second group 400 excite an electrical current synchronously with the second phase control signal 112. The solid-state switches of the third group 500 and the fourth group 600 behave accordingly.

The resonant mode which can be excited in the hollow conductor 200 of the RF generator 100 is established by the selection of the positions at which the slots 210, 220, 230, 240 are provided in the wall 250 of the hollow conductor 200, and by, the selection of the phase relationships of the phase control signals 111, 112, 113, 114 with respect to one another.

Instead of the separate slots 210 and 220, and 230 and 240, it is likewise respectively possible to provide a single continuous slot on each side of the hollow conductor 200. One or more groups of solid-state switches may then be arranged on each of the slots.

Figure 5:
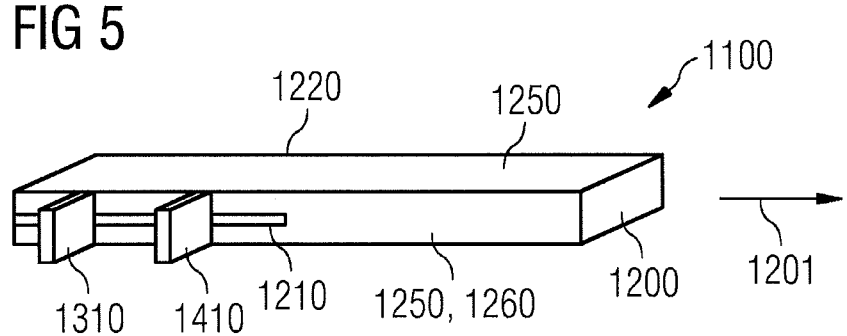
FIG. 5 shows a first perspective representation of an RF generator according to a second embodiment.

FIG. 5 shows a schematic perspective representation of an RF generator 1100 according to a second embodiment. The RF generator 1100 is used to generate radiofrequency electromagnetic waves with a high power. The RF power generated by the RF generator 1100 may also be used, for example, in a particle accelerator to accelerate charged particles.

The RF generator 1100 comprises a hollow conductor 1200, which substantially has a hollow cylindrical shape and is formed of an electrically conductive material, preferably a metal. The axial direction of the cylindrical hollow conductor 1200 defines a longitudinal direction 1201. The hollow conductor 1200 has a rectangular cross section.

A lateral surface of the cylindrical hollow conductor 1200 is formed by a wall 1250. When an electromagnetic resonant mode is excited in the hollow conductor 1200, position- and time-dependent electrical currents flow in the wall 1250, the spatial and temporal profile of which can be calculated and is known to persons skilled in the art.

On a narrow side 1260 of the hollow conductor 1200 extending in the longitudinal direction 1201, the wall 1250 comprises a first slot 1210. A further narrow side (not visible in FIG. 5) of the hollow conductor 1200, lying opposite the narrow side 1260, comprises a third slot 1230. The first slot 1210 and the third slot 1230 both extend in the longitudinal direction 1201. When an electromagnetic resonant mode is excited in the hollow conductor 1200, electrical currents which are oriented perpendicularly to the slots 1210, 1230 flow in the wall 1250 of the hollow conductor 1200. Reciprocally, electrical resonant modes can be excited in the hollow conductor 1200 by excitation of electrical currents flowing perpendicularly to the slots 1210, 1230 in the wall 1250.

Figure 6:
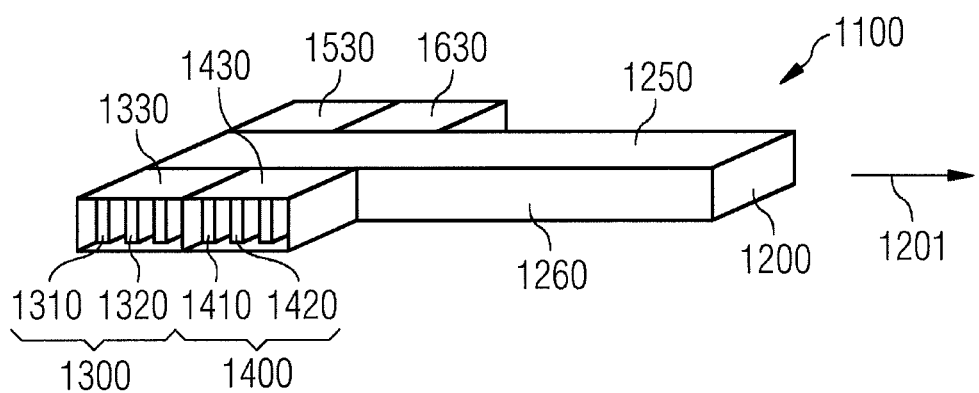
FIG. 6 shows a second perspective representation of the RF generator of the second embodiment.

FIG. 6 shows that a first group 1300 of solid-state switches, which comprises a first solid-state switch 1310, a second solid-state switch 1320 and further solid-state switches, is arranged on the first slot 1210. The first group 1300 of solid-state switches 1310, 1320 is arranged in a first shielding housing 1330, which fully encloses the first group 1300 of solid-state switches. A second group 1400 of solid-state switches, which comprises a third solid-state switch 1410, a fourth solid-state switch 1420 and further solid-state switches, is furthermore arranged on the first slot 1210. The second group 1400 of solid-state switches 1410, 1420 is arranged in a second shielding housing 1430, which encloses the solid-state switches 1410, 1420 of the fourth group 1400 in all spatial directions. Correspondingly, a third group 1500 of solid-state switches in a third shielding housing 1530 and a fourth group 1600 of solid-state switches in a fourth shielding housing 1630 are arranged on the third slot 1230.

In contrast to the RF generator 100 of the first embodiment, in the RF generator 1100 of the second embodiment a plurality of groups 1300, 1400, 1500, 1600 of solid-state switches are therefore arranged on each slot 1210, 1230. As an alternative, however, it would also be possible to provide two separate slots instead of the first slot 1210, and to arrange the first group 1300 on the first of these slots and the second group 1200 on the second of these slots. The third slot 1230 could also correspondingly be replaced by two or more separate slots. It would likewise be possible respectively to provide more than two groups of solid-state switches on the first slot 1210 and on the third slot 1230. Each of the groups 1300, 1400, 1500, 1600 may comprise an arbitrary number of solid-state switches.

The solid-state switches of the RF generator 1100 of the second embodiment correspond in structure and functionality to those of the RF generator 100 of the first embodiment.

Figure 7:
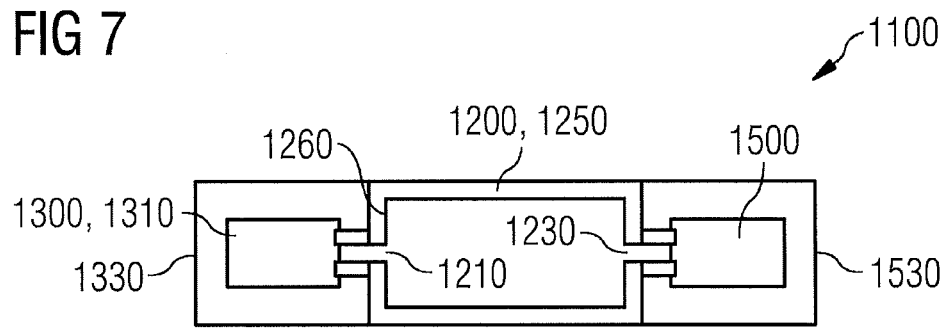
FIG. 7 shows a sectional representation of the RF generator of the second embodiment.

FIG. 7 shows a section through the RF generator 1100 in a schematic representation. It can be seen that each of the solid-state switches of the groups 1300, 1400, 1500, 1600 is connected to sections of the wall 1250 on either side of the slot 1210, 1230 assigned to the respective group 1300, 1400, 1500, 1600, in order to apply a radiofrequency electrical voltage through the respective slot 1210, 1230. The structure of the RF generator 1100 to this extent corresponds to that of the RF generator 100 of the first embodiment.

Figure 8:
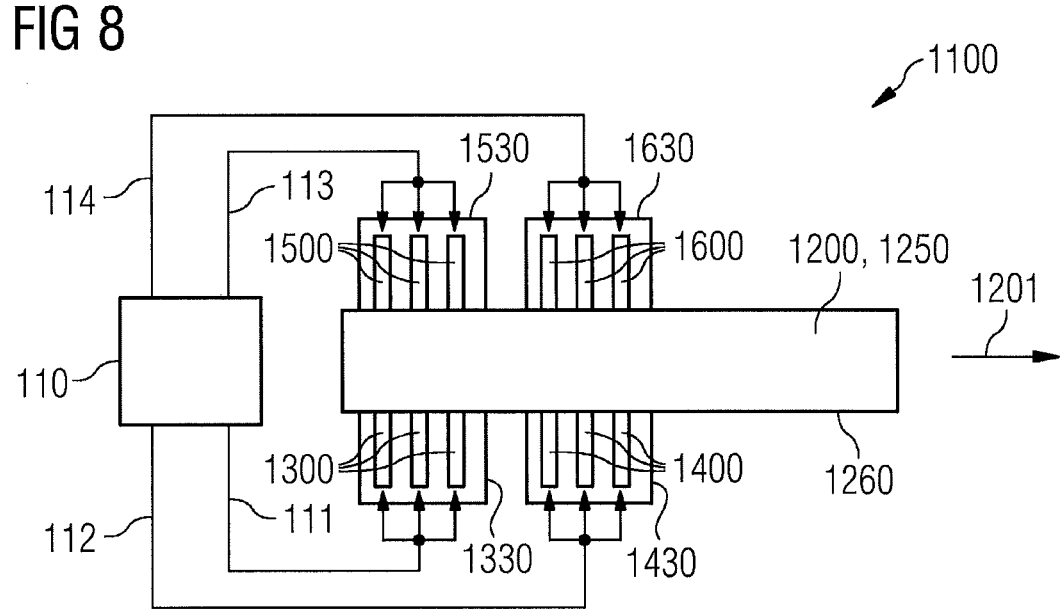
FIG. 8 shows a plan view of the RF generator of the second embodiment.

FIG. 8 shows a schematic plan view of the RF generator 1100. The hollow conductor 1200 with the first group 1300 of solid-state switches 1310, 1320, the second group 1400 of solid-state switches 1410, 1420, the third group 1500 of solid-state switches and the fourth group 1600 of solid-state switches can be seen.

The RF generator 1100 furthermore comprises the phase control device 110, which has already been explained in connection with the RF generator 100 of the first embodiment. The electrical currents flowing in the wall 1250 of the hollow conductor 1200 are position- and time-dependent. If for example a TE10 resonant mode is excited in the hollow conductor 1200, then at each instant the electrical current flowing at the position of the first group 1300 of solid-state switches is phase-shifted by exactly 180° with respect to the current flowing at the position of the second group 1400 of solid-state switches. A corresponding situation applies for the third group 1500 of solid-state switches and the fourth group 1600 of solid-state switches.

The phase control device 110 is formed so as to generate the phase control signals 111, 112, 113, 114. The first phase control signal 111 is delivered to the first group 1300 of solid-state switches. The second phase control signal 112 is delivered to the second group 1400 of solid-state switches. The third phase control signal 113 is delivered to the third group 1500 of solid-state switches. The fourth phase control signal 114 is delivered to the fourth group 1600 of solid-state switches.

The phase control signals 111, 112, 113, 114 respectively have the same frequency, but are phase-shifted with respect to one another. If for example a TE10 resonant mode is intended to be excited in the hollow conductor 1200 of the RF generator 1100, then the first phase control signal 111 and the second phase control signal 112 are offset by 180° with respect to one another. Correspondingly, the third phase control signal 113 and the fourth phase control signal 114 are also phase-shifted by 180° with respect to one another.

The electromagnetic power generated in the hollow conductors 200, 1200 of the RF generators 100, 1100 is transported through the hollow conductors 200, 1200 in the longitudinal direction 201, 1201. At a longitudinal end of the respective hollow conductor 200, 1200, the electromagnetic power can be coupled out from the hollow conductor 200, 1200. A cavity, into which the RF power generated by the RF generator 100, 1100 is coupled, may for example be arranged at a longitudinal end of the hollow conductor 200, 1200. Suitable coupling elements are known from the related art. The RF power generated by the RF generator 100, 1100 may also be used in a particle accelerator to accelerate charged particles. In this case, the hollow conductor 200, 1200 of the RF generator 100, 1100 may, for example, be coupled to a cavity of the particle accelerator.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV,* 69 USPQ2d 1865 (Fed. Cir. 2004).

The invention claimed is:

1. An RF generator for the generation of RF power and the delivery of the generated RF power, wherein the generated RF power is to be coupled into a cavity of a particle accelerator, comprising:
   a hollow conductor having a conductive wall, the wall comprising a first longitudinal slot elongated along a longitudinal direction of the hollow conductor and perpendicular to a direction of current flow during an excited resonant mode in the hollow conductor; and
   a first solid-state switch extending across the first slot along a circumferential direction of the conductive wall to apply a radiofrequency electrical voltage through the first slot.

2. The RF generator as claimed in claim 1, wherein the hollow conductor has a circular cross section.

3. The RF generator as claimed in claim 1, wherein the hollow conductor has a rectangular cross section.

4. The RF generator as claimed in claim 3, wherein the RF generator is formed so as to excite a TE10 resonant mode in the hollow conductor.

5. The RF generator as claimed in claim 1, wherein the first solid-state switch is arranged in a shielding housing.

6. The RF generator as claimed in claim 1, wherein the RF generator further comprises a phase control device to generate a first phase control signal, and the first phase control signal is supplied to the first solid-state switch.

7. The RF generator as claimed in claim 6, wherein:
   a third solid-state switch is positioned over the first slot together with the first solid-state switch,
   the phase control device also generates a second phase control signal, and
   the second phase control signal is supplied to the third solid-state switch.

8. The RF generator as claimed in claim 7, wherein the phase control device generates the second phase control signal with a phase shift of 180° with respect to the first phase control signal.

9. The RF generator as claimed in claim 1, wherein a second solid-state switch is positioned over the first slot together with the first solid-state switch.

10. The RF generator as claimed in claim 9, wherein the first and second solid-state switches are arranged in a common shielding housing.

11. The RF generator as claimed in claim 9, wherein
    the RF generator further comprises a phase control device to generate a first phase control signal, and
    the first phase control signal is supplied to the first and second solid-state switches.

12. The RF generator as claimed in claim 9, wherein a third solid-state switch is positioned over the first slot together with the first and second solid-state switches.

13. The RF generator as claimed in claim 1, wherein:
    the wall comprises a second slot, and a third solid-state switch is positioned over the second slot.

14. The RF generator as claimed in claim 13, wherein:
the first solid-state switch is arranged in a first shielding housing, and
the third solid-state switch is arranged in a second shielding housing.

15. The RF generator as claimed in claim 13, wherein:
the RF generator further comprises a phase control device to generate first and second phase control signals,
the first phase control signal is supplied to the first solid-state switch, and
the second phase control signal is supplied to the third solid-state switch.

16. The RF generator as claimed in claim 15, wherein the phase control device generates the second phase control signal with a phase shift of 180° with respect to the first phase control signal.

17. The RF generator as claimed in claim 1, wherein:
a third solid-state switch is positioned over the first slot together with the first solid-state switch,
the first solid-state switch is arranged in a first shielding housing, and
the third solid-state switch is arranged in a second shielding housing.

18. The RF generator as claimed in claim 1, wherein the hollow conductor is coupled to a cavity.

19. The RF generator as claimed in claim 1, wherein the first solid-state switch extends in a plane perpendicular to a longitudinal axis of the hollow conductor.

20. A particle accelerator comprising:
a particle accelerator cavity; and
an RF generator coupled to the particle accelerator cavity, the RF generator comprising:
a hollow conductor having a conductive wall, the wall comprising a first longitudinal slot elongated along a longitudinal direction of the hollow conductor and perpendicular to a direction of current flow during an excited resonant mode in the hollow conductor; and
a first solid-state switch extending across the first slot along a circumferential direction of the conductive wall to apply a radiofrequency electrical voltage through the first slot.

* * * * *